US009288916B2

(12) United States Patent
Nakamura

(10) Patent No.: US 9,288,916 B2

(45) Date of Patent: Mar. 15, 2016

(54) ELECTRONIC DEVICE, CABLE COUPLING STRUCTURE, AND METHOD OF FABRICATING ELECTRONIC DEVICE

(71) Applicant: OLYMPUS CORPORATION, Tokyo (JP)

(72) Inventor: Mikio Nakamura, Tokyo (JP)

(73) Assignee: OLYMPUS CORPORATION, Tokyo (JP)

(*) Notice: Subject to any disclaimer, the term of this patent is extended or adjusted under 35 U.S.C. 154(b) by 363 days.

(21) Appl. No.: 13/669,862

(22) Filed: Nov. 6, 2012

(65) Prior Publication Data

US 2013/0062110 A1 Mar. 14, 2013

Related U.S. Application Data

(63) Continuation of application No. PCT/JP2011/060520, filed on May 2, 2011.

(30) Foreign Application Priority Data

May 7, 2010 (JP) ................................ 2010-107122

(51) Int. Cl.
*H05K 1/16* (2006.01)
*H05K 1/09* (2006.01)
(Continued)

(52) U.S. Cl.
CPC .................. *H05K 3/403* (2013.01); *H05K 3/32* (2013.01); *H05K 2201/10356* (2013.01); *Y10T 29/49117* (2015.01)

(58) Field of Classification Search
CPC .................... H05K 3/403; H05K 3/32; H05K 2201/10356; Y10T 29/49117
USPC .......... 174/250, 254, 257, 260; 361/749–751, 361/760, 761–764
See application file for complete search history.

(56) References Cited

U.S. PATENT DOCUMENTS 4,931,908 A * 6/1990 Boucard et al. ............... 361/743
5,036,301 A * 7/1991 Takao et al. .................. 333/185
(Continued)

FOREIGN PATENT DOCUMENTS

EP 0 557 812 A2 9/1993
JP 5-235498 A 9/1993
(Continued)

OTHER PUBLICATIONS

International Search Report dated Jun. 7, 2011 issued in PCT/JP2011/060520.

(Continued)

*Primary Examiner* — Sherman Ng

(74) *Attorney, Agent, or Firm* — Scully, Scott, Murphy & Presser, PC

(57) ABSTRACT

A structure includes a substrate on a surface of which a functional element and a first electrode are disposed, wherein the functional element provides a predetermined function by an operation based on an electrical signal and the first electrode is coupled to the functional element; an insulating member in a thin film that covers the surface of the substrate and extends from an end of the substrate; and a second electrode disposed on a substrate-side surface of the extending portion, which is extending from the end of the substrate, of the insulating member, wherein the second electrode is coupled to the first electrode. The second electrode is electrically coupled to a coaxial cable.

14 Claims, 6 Drawing Sheets

3 50 51 2 21 20 22 C 41 4

(51) Int. Cl.

| | |
|---|---|
| ***H05K 1/00*** | (2006.01) |
| ***H05K 1/18*** | (2006.01) |
| ***H05K 3/40*** | (2006.01) |
| ***H05K 3/32*** | (2006.01) |

(56) References Cited

U.S. PATENT DOCUMENTS

| | | | | |
|---|---|---|---|---|
| 5,084,961 | A * | 2/1992 | Yoshikawa | 29/840 |
| 5,239,448 | A * | 8/1993 | Perkins et al. | 361/764 |
| 5,266,746 | A * | 11/1993 | Nishihara et al. | 174/254 |
| 5,384,691 | A * | 1/1995 | Neugebauer et al. | 361/794 |
| 5,452,182 | A * | 9/1995 | Eichelberger et al. | 361/749 |
| 5,528,403 | A * | 6/1996 | Kawaguchi et al. | 349/149 |
| 5,856,913 | A * | 1/1999 | Heilbronner | 361/760 |
| 5,912,435 | A * | 6/1999 | Elsinger et al. | 174/117 F |
| 6,842,093 | B2 * | 1/2005 | Tamaki et al. | 333/260 |
| 7,348,492 | B1 * | 3/2008 | Kawai et al. | 174/254 |
| 8,252,365 | B2 * | 8/2012 | Tsukamoto | 427/100 |
| 2003/0094305 | A1 * | 5/2003 | Ueda | 174/254 |
| 2004/0057220 | A1 | 3/2004 | Tamaki et al. | |
| 2009/0284937 | A1 * | 11/2009 | Rytky | 361/749 |

FOREIGN PATENT DOCUMENTS

| | | | |
|---|---|---|---|
| JP | 2000-277882 | A | 10/2000 |
| JP | 2001-068175 | A | 3/2001 |
| JP | 2004-247813 | A | 9/2004 |
| JP | 2009-81010 | A | 4/2009 |
| JP | 2010-103696 | A | 5/2010 |

OTHER PUBLICATIONS

Notice of Rejection dated Dec. 10, 2013 from related Japanese Application No. 2010-107122, together with an English language translation.

Extended Supplementary European Search Report dated Jan. 3, 2014 from related European Application No. 11 77 7459.6.

* cited by examiner

ELECTRONIC DEVICE, CABLE COUPLING STRUCTURE, AND METHOD OF FABRICATING ELECTRONIC DEVICE

CROSS-REFERENCE TO RELATED APPLICATIONS

This application is a continuation of PCT international application Ser. No. PCT/JP2011/060520 filed on May 2, 2011 which designates the United States, incorporated herein by reference, and which claims the benefit of priority from Japanese Patent Application No. 2010-107122, filed on May 7, 2010, incorporated herein by reference.

BACKGROUND OF THE INVENTION

1. Field of the Invention

The present invention relates to an electronic device where a substrate is coupled to a cable, a cable coupling structure, and a method of fabricating the electronic device.

2. Description of the Related Art

As a coupling structure of a coaxial cable, there is known a structure in which a slit is formed on a top surface of a printed circuit board and coupling patterns to be coupled to an external conductor are formed on both sides of the slit (see, for example, Japanese Patent Application Laid-open No. 2001-068175). In the technique disclosed in Japanese Patent Application Laid-open No. 2001-068175, because the external conductor of the coaxial cable is placed in the slit of the printed circuit board to couple the external conductor to the coupling patterns on the both sides of the slit, an installation height of the coaxial cable can be reduced by the depth of the slit.

In some cases, on the above-described substrate, a functional element that performs a predetermined operation from the substrate surface to the outside, such as a piezoelectric element that emits a measurement wave including an ultrasonic wave and an optical element that emits a light, is disposed. When the substrate is mounted on equipment, the functional element performs a predetermined operation, such as vibration for generating a wave including a sound wave and irradiation of a light, on the equipment surface. In order to attain a sufficient effect of the functional element, it is preferred that the functional element be disposed as close to the equipment surface as possible.

SUMMARY OF THE INVENTION

A method of fabricating an electronic device to be electrically coupled to a cable according to an aspect of the present invention includes: mounting, on a same surface of a plate-shaped base material, a functional element, a first electrode, a second electrode that is to be coupled to the cable, and a wiring that couples the first electrode and the second electrode together, the functional element providing a predetermined function by an operation based on an electrical signal, the first electrode being coupled to the functional element; forming an insulating member in a thin film covering the surface; and etching part of the base material, the part of the base material including an area on which the second electrode is formed, the part of the base material being an area other than an area on which the functional element and the first electrode are formed.

An electronic device according to another aspect of the present invention includes: a substrate on a surface of which a functional element and a first electrode are disposed, the functional element providing a predetermined function by an operation based on an electrical signal, the first electrode being coupled to the functional element; an insulating member in a thin film, the insulating member covering the surface of the substrate and extending from an end of the substrate; and a second electrode disposed on a substrate-side surface of the extending portion, which is extending from the end of the substrate, of the insulating member, the second electrode being coupled to the first electrode.

A cable coupling structure according to still another aspect of the present invention includes: a substrate on a surface of which a functional element and a first electrode are disposed, the functional element providing a predetermined function by an operation based on an electrical signal, the first electrode being coupled to the functional element; an insulating member in a thin film, the insulating member covering the surface of the substrate and extending from an end of the substrate; a second electrode disposed on a substrate-side surface of the extending portion, which is extending from the end of the substrate, of the insulating member, the second electrode being coupled to the first electrode; and a cable electrically coupled to the second electrode.

The above and other features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1:
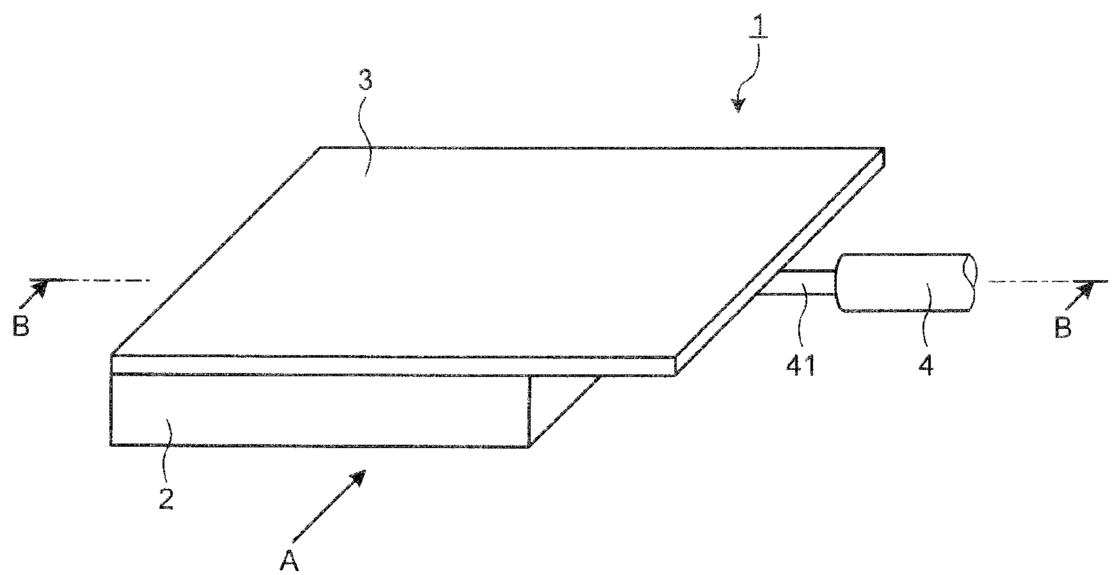
FIG. 1 is a perspective view schematically illustrating a cable coupling structure according to a first embodiment of the present invention.

Embodiments of the present invention will be described in detail below by referring to the accompanying drawings. The following embodiments do not limit the present invention. The respective drawings referred in the description schematically illustrate a shape, a size, and a positional relationship such that the present invention can be understood. Therefore, the present invention is not limited to the shape, the size, and the positional relationship illustrated in the drawings.

First Embodiment

Figure 2:
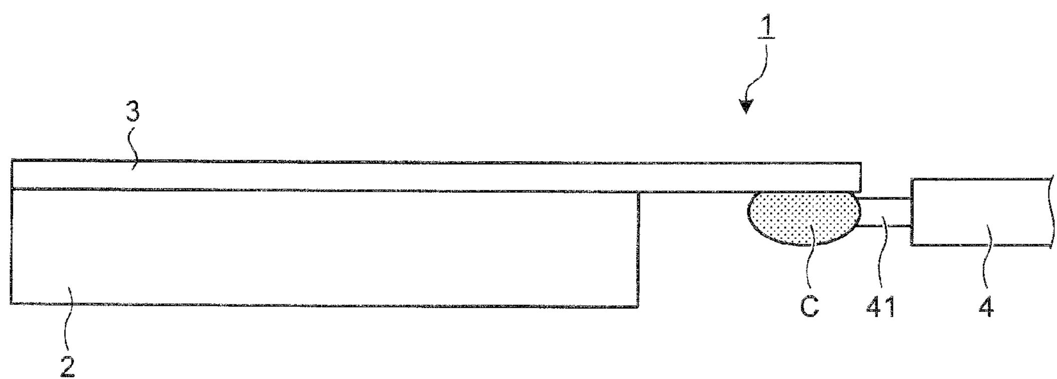
FIG. 2 is a plan view of an electronic device illustrated in FIG. 1 viewed in arrow A direction.
Figure 3:
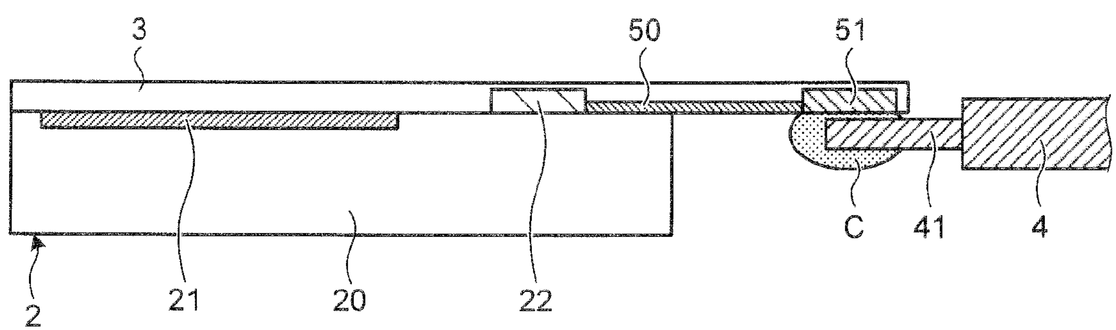
FIG. 3 is a partial cross-sectional view taken along line B-B of the electronic device in FIG. 1.

FIG. 1 is a perspective view schematically illustrating a cable coupling structure according to a first embodiment of the present invention. FIG. 2 is a plan view of an electronic device 1 illustrated in FIG. 1 viewed in arrow A direction. FIG. 3 is a partial cross-sectional view taken along line B-B of the electronic device in FIG. 1. As illustrated in FIG. 1, the electronic device 1 includes an insulating member 3 in a thin film, which covers a substrate 2. The insulating member 3 is coupled to a center conductor 41 of a coaxial cable 4.

The substrate 2 includes a base material 20, a functional element 21, and a first electrode 22 as illustrated in FIG. 3. The base material 20 is made of an insulating material such as silicon resin. The functional element 21 is disposed on one surface of the base material 20. The first electrode 22 is electrically coupled to the functional element 21 on the surface or inside of the base material 20. The first electrode 22 is coupled to a second electrode 51 by wiring 50.

The functional element 21 is an element that provides a predetermined function by an operation based on an electrical signal. For example, the functional element 21 employs Capacitive Micro-machined Ultrasonic Transducers (C-MUT), which has acoustic characteristics, and transmits and receives a signal of an ultrasonic sound wave using a large number of micro sensors.

The insulating member 3 is formed in a thin film made of insulating resin such as polyimide. The insulating member 3 holds the second electrode 51 in an area extending from an end of the base material 20, the area being a surface (a surface of the substrate 2 side) that faces the surface on which the functional element 21 is formed.

The coaxial cable 4 includes a center conductor 41 as a cable core, an external conductor as a shielding line, and an external insulator. The external conductor is formed around an internal insulator on the outer periphery of the center conductor 41. On the outer periphery of the external conductor, the external insulator is disposed. The coaxial cable 4 has a distal end where the center conductor 41 protrudes in a longitudinal direction of the coaxial cable 4. The distal end of the coaxial cable 4 is coupled to the second electrode 51 with solder C.

Figure 4A:
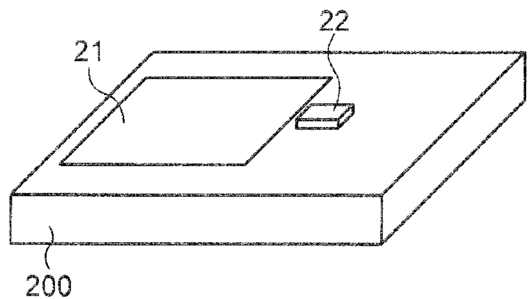
FIG. 4A is a perspective view illustrating a method of fabricating the electronic device according to the first embodiment of the present invention.
Figure 4B:
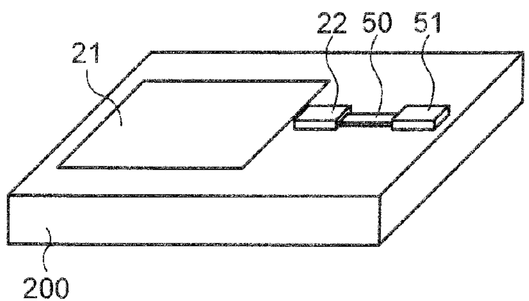
FIG. 4B is a perspective view illustrating the method of fabricating the electronic device according to the first embodiment of the present invention.

FIGS. 4A to 4E are perspective views illustrating a method of fabricating the electronic device according to the first embodiment. First, the functional element 21 and the first electrode 22, which is electrically coupled to the functional element 21, are mounted on a base material for device fabrication 200 (FIG. 4A). Subsequently, the second electrode 51 and the wiring 50, which couples the first electrode 22 and the second electrode 51 together, are mounted (FIG. 4B). The wiring 50 and the second electrode 51 may employ a conductive material similar to that of the first electrode 22, or employ a conductive material that is different from that of the first electrode 22. The wiring 50 and the second electrode 51 may employ any material insofar as the material has electrical conductivity.

Figure 4C:
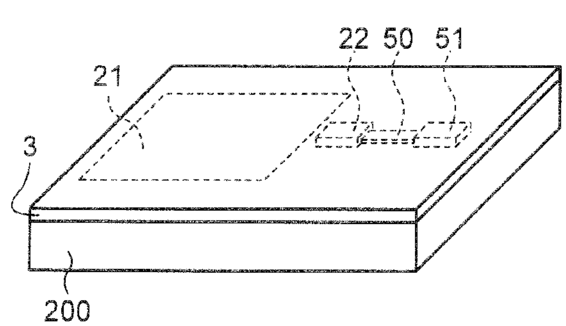
FIG. 4C is a perspective view illustrating the method of fabricating the electronic device according to the first embodiment of the present invention.

After forming the wiring and the electrode in FIG. 4B, the surface of the base material for device fabrication 200, on which the functional element 21, the first electrode 22, and the second electrode 51 are formed, is coated with the insulating member 3 (see FIG. 4C).

Figure 4D:
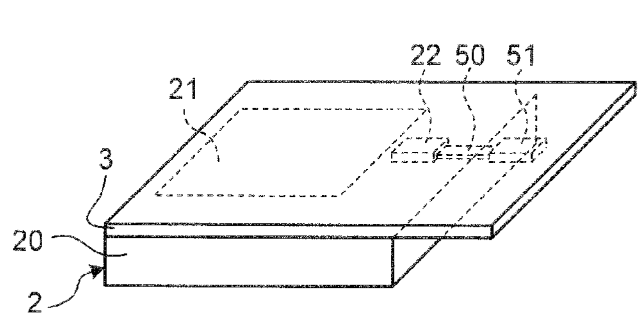
FIG. 4D is a perspective view illustrating the method of fabricating the electronic device according to the first embodiment of the present invention.

Thereafter, as illustrated in FIG. 4D, an area of the base material for device fabrication 200 in FIG. 4C is subjected to etching substantially in a pillar shape, the area being not the area where the functional element 21 and the first electrode 22 are formed but including the second electrode 51. That is, the base material for device fabrication 200 is partially removed by etching so as to expose the second electrode 51. The second electrode 51 is held by the insulating member 3 side. In the first embodiment, the etched shape may be any shape insofar as the etched shape exposes at least the second electrode 51 and allows the center conductor 41 of the coaxial cable 4 to be coupled to the second electrode 51 from the end of the insulating member 3. With this, the second electrode 51 is arranged on the substrate 2 side surface of the insulating member 3.

Figure 4E:
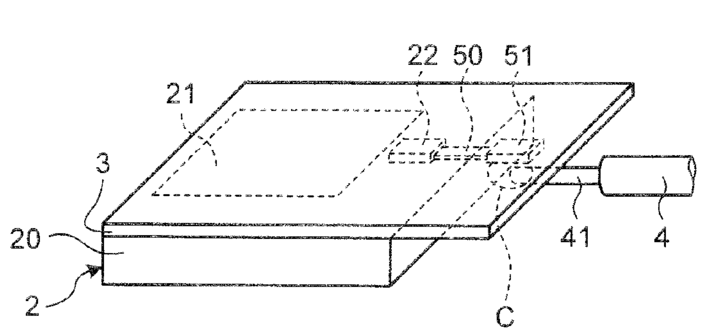
FIG. 4E is a perspective view illustrating the method of fabricating the electronic device according to the first embodiment of the present invention.

After completion of the etching, the center conductor 41 of the coaxial cable 4 is coupled to the second electrode 51 with the solder C and the like as illustrated in FIG. 3, so that the electronic device can be fabricated (FIG. 4E).

With the above-described electronic device 1 according to the first embodiment, even in the case where the first electrode 22 coupled to the functional element 21 is disposed on the surface on which the functional element 21 is formed, the second electrode 51 coupled to the first electrode 22 is formed and covered with the insulating member 3 such that the second electrode 51 is exposed at the surface in a different direction from the surface of the substrate where the functional element is formed. Thus, the functional element 21 can be coupled to the coaxial cable 4 via the electrodes without coupling the cable from the surface at the side where the functional element 21 is formed. As a result, the installation height of the substrate 2 at the surface side on which the functional element 21 is formed is not increased, and thus the functional element 21 can be arranged at the equipment surface of the substrate 2 on the equipment.

The base material for device fabrication 200 may be etched only in a close area of the second electrode 51 in the insulating member 3 in FIG. 4D insofar as the second electrode 51 can be coupled to the coaxial cable 4.

Second Embodiment

Figure 5:
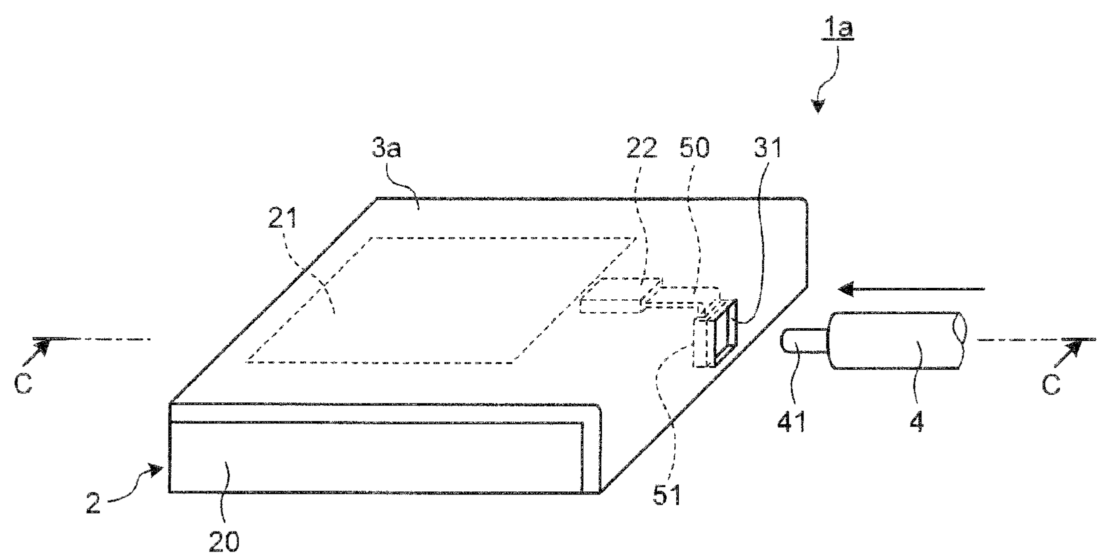
FIG. 5 is a perspective view schematically illustrating a cable coupling structure according to a second embodiment of the present invention.
Figure 6:
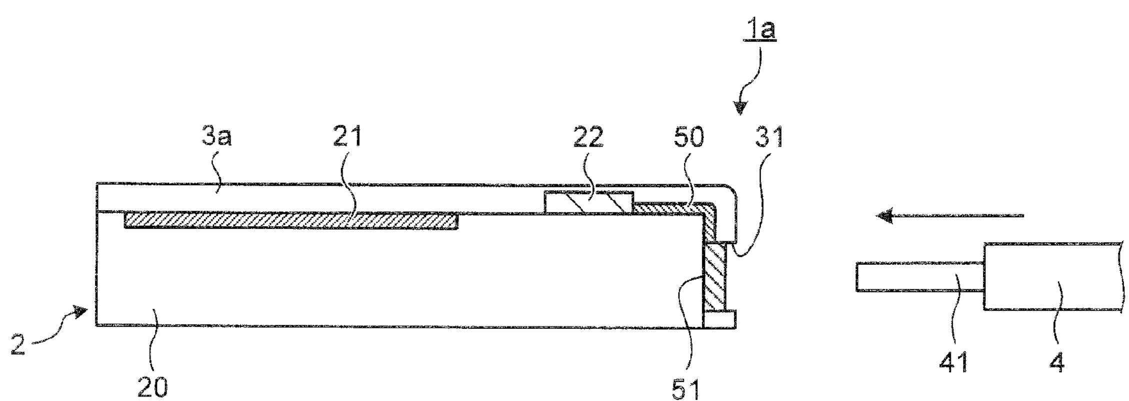
FIG. 6 is a partial cross-sectional view taken along line C-C of an electronic device in FIG. 5.

FIG. 5 is a perspective view illustrating a cable coupling structure according to a second embodiment of the present invention. FIG. 6 is a cross-sectional view taken along line C-C of an electronic device 1*a* in FIG. 5. The electronic device 1*a* illustrated in FIGS. 5 and 6 is coupled to the coaxial cable 4 from a side face of the substrate 2. An insulating member 3*a* is folded at an end of the substrate 2.

The electronic device 1*a* has a coupling hole 31 that is formed as follows. The insulating member 3*a*, which extends from the substrate 2, is folded toward the base material 20 side at an end of a contacting surface in contact with the insulating member 3*a* of the substrate 2. The coupling hole 31 is formed by etching the surface, which is opposite side of the contacting surface in contact with the substrate 2, of the insulating member 3*a* at an area in a position corresponding to the second electrode 51. The second electrode 51 is coupled to the coaxial cable 4 through the coupling hole 31. At this time, in the electronic device 1*a*, a distance from the end of the base material 20 etched in FIG. 4D to the end of the insulating member 3*a* (the shortest distance) is formed to be equal to or less than a thickness of the base material 20. Alternatively, the base material for device fabrication 200 is etched such that this distance relationship is satisfied.

The electronic device 1*a* is fabricated with additional processes of a folding process and a second etching process in addition to the fabrication process described in FIGS. 4A to 4E. The folding process folds the insulating member 3*a* toward the base material 20 side at the end of the substrate 2. The second etching process etches a portion corresponding to the second electrode 51 of the insulating member 3*a* after the folding. The folding process and the second etching process may be performed in an inverse order. The second etching process may be performed after the process of FIG. 4C.

With the above-described electronic device 1*a* according to the second embodiment, coupling can be made from the side face to the surface on which the functional element 21 is formed. Similarly to the first embodiment, this prevents the coaxial cable 4 from increasing the installation height of the substrate 2 on the surface side at which the functional element 21 is formed, and the functional element 21 can be arranged at the equipment surface.

In the second embodiment, a description is given of an example where the insulating member 3*a* is formed with a thickness that covers the second electrode 51, and the area corresponding to the second electrode 51 is etched. The insulating member 3*a* may be formed with a thickness equal to the second electrode 51, and may be directly coupled without etching.

Figure 7:
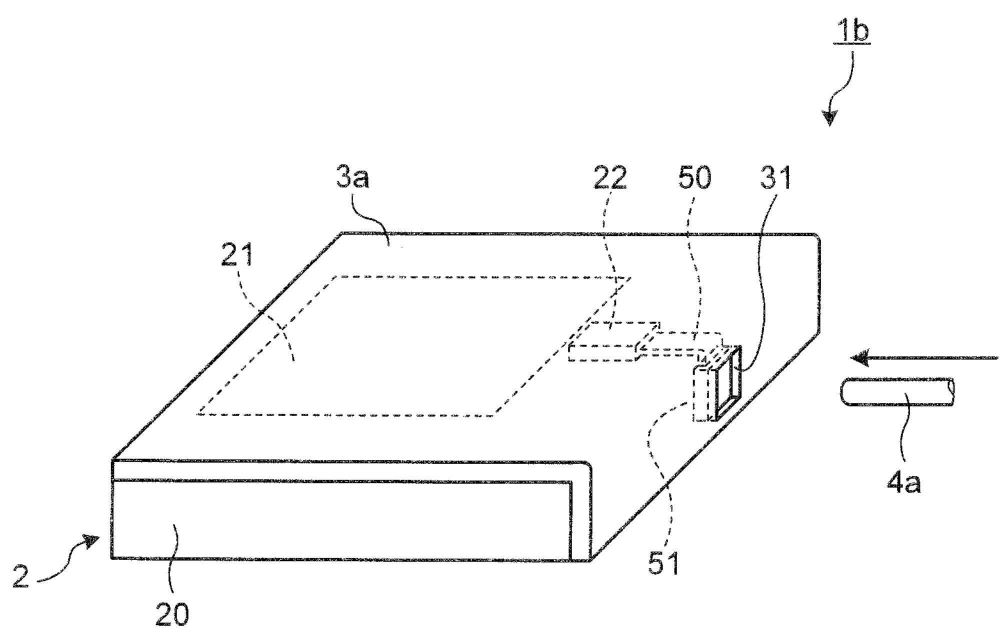
FIG. 7 is a perspective view schematically illustrating an electronic device of Modification 1 according to the second embodiment of the present invention.

FIG. 7 is a perspective view illustrating an electronic device 1*b* of Modification 1 according to the second embodiment. As illustrated in FIG. 7, a coaxial cable 4*a*, a cable end surface of which is flattened by end surface processing, may be coupled.

At a distal end surface of the coaxial cable 4*a*, a conductive film is disposed on an exposed portion of the center conductor, so that the exposed portion (distal end) of the center conductor is flattened. On the exposed portion of the external conductor, the conductive films are concentrically disposed along the exposed portion to flatten the exposed portion (distal end) of the external conductor. These conductive films may employ a metal film, may be formed by electrolytic plating, non-electrolytic plating, or sputtering. The coaxial cable 4*a* is bonded to the second electrode 51 via an anisotropic conductive material such as an anisotropic conductive film (ACF) or anisotropic conductive paste (ACP). The conductive film may employ a single layer structure or a multilayer structure. A multilayer structure where Au layer and Ni layer are formed from the outermost surface in this order ensures strong bonding to the second electrode 51, which is preferable. A structure that employs a Ni—Au film ensures coupling to the second electrode 51 by not only bonding with the anisotropic conductive material such as ACF and ACP but also solder bump bonding or Au bump bonding, which increases flexibility in coupling.

Figure 8:
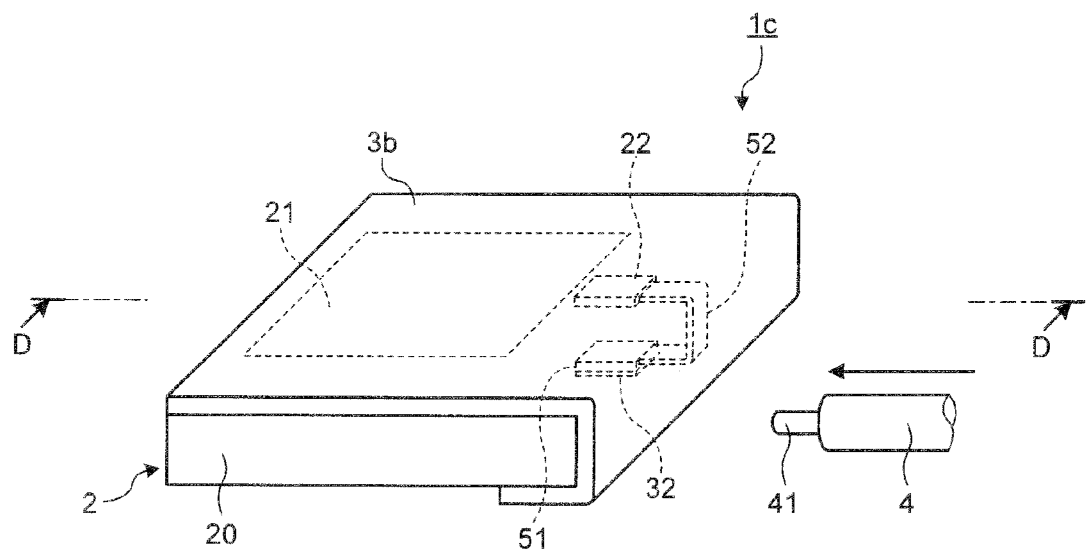
FIG. 8 is a perspective view schematically illustrating a cable coupling structure of Modification 2 according to the second embodiment of the present invention.
Figure 9:
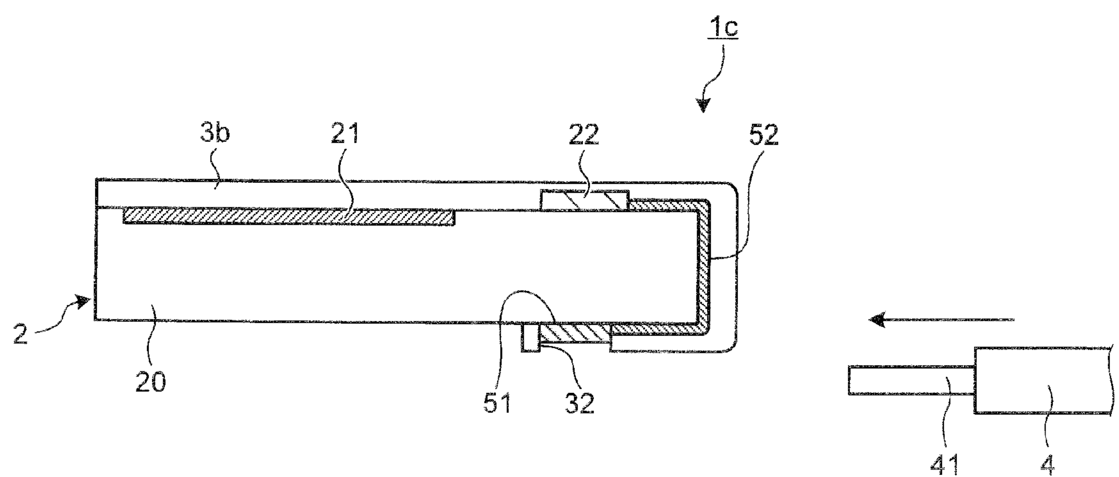
FIG. 9 is a partial cross-sectional view taken along line D-D of an electronic device in FIG. 8.

FIG. 8 is a perspective view illustrating an electronic device 1*c* of Modification 2 according to the second embodiment. FIG. 9 is a cross-sectional view taken along line D-D of the electronic device 1*c* in FIG. 8. In the electronic device 1*c* in FIGS. 8 and 9, an insulating member 3*b* is folded at an end of the substrate 2, and the coaxial cable 4 is coupled from the back side of the surface, on which the functional element 21 is formed, in the substrate 2.

The electronic device 1*c* has a coupling hole 32 that is formed as follows. The insulating member 3*b*, which extends from the substrate 2, is folded at an end of a contacting surface in contact with the insulating member 3*b* of the substrate 2 to arrange the second electrode on the back surface of the surface, on which the functional element 21 is formed. The coupling hole 32 is formed by etching the insulating member 3*b* at an area in a position corresponding to the second electrode 51 on the back surface of a contacting surface in contact with the substrate 2 of the insulating member 3*b*. The second electrode 51 is coupled to the coaxial cable 4 through the coupling hole 32. At this time, in the second electrode 51, the base material for device fabrication 200 is etched such that the distance from the end of the base material 20 etched in FIG. 4D to the insulating member 3*b* has a length equal to or more than a thickness of the base material 20. Additionally, the base material for device fabrication 200 is etched such that the maximum value of the distance from the end of the insulating member 3*b* to the second electrode 51 is a value equal to or less than a difference between the distance, which is the distance from the end of the insulating member 3*b* to the end of the base material 20, and the thickness of the base material 20.

In this case, in the fabrication method in FIGS. 4A to 4E, the second electrode 51 and the wiring 52, which couples the second electrode 51 to the first electrode 22, are mounted on the surface of the base material for device fabrication 200 such that the second electrode 51 is disposed on the back surface of the surface, on which the functional element 21 is formed, when the insulating member 3*b* is folded.

The coaxial cable 4 may have a coupling direction to the substrate 2 that is oriented to the side face of the substrate 2 as illustrated in FIGS. 8 and 9, or oriented to the back side of the surface on which the functional element 21 is formed.

While in the first and second embodiments described above, the description is given of the example where the coaxial cable is coupled to the substrate, the configuration is not limited to this. A different kind of cable from the coaxial cable is similarly applicable to these embodiments. The available substrate may be any substrate insofar as the substrate includes a functional portion and an electrode to be coupled to the functional portion on the same planar surface. For example, a typical substrate includes a surface where a piezoelectric element that emits a measurement wave such as an ultrasonic wave, an optical element that emits a light, or a similar element is mounted while an electrode is also mounted on the same surface.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electronic device, comprising:

a substrate having a surface, of which a functional element and a first electrode being disposed on the surface, the functional element providing a predetermined function by an operation based on an electrical signal, the first electrode being electrically coupled to the functional element;

an insulating member formed on the substrate and having an opposing surface facing the surface of the substrate to cover in a thin film, the insulating member covering an entirety of the surface of the substrate, the insulating member having an extending portion extending from an end of the substrate; and a second electrode disposed on the opposing surface of the extending portion of the insulating member, the second electrode being electrically coupled to the first electrode.

2. The electronic device of claim 1, wherein the opposing surface is exposed in the extending portion.

3. The electronic device of claim 2, wherein the extending portion is cantilevered from the end of the substrate.

4. The electronic device of claim 1, wherein the opposing surface opposes an end surface of the substrate in the extending portion.

5. The electronic device of claim 1, wherein the opposing surface of the insulating member further covers one or more of the first electrode and functional element.

6. The electronic device of claim 1, further comprising a wiring disposed in the surface of the substrate to electrically connect the first and second electrodes.

7. A cable coupling structure, comprising:

a substrate having a surface, of which a functional element and a first electrode being disposed on the surface, the functional element providing a predetermined function by an operation based on an electrical signal, the first electrode being electrically coupled to the functional element;

an insulating member formed on the substrate and having an opposing surface facing the surface of the substrate to cover in a thin film, the insulating member covering an entirety of the surface of the substrate, the insulating member having an extending portion extending from an end of the substrate;

a second electrode disposed on the opposing surface of the extending portion of the insulating member, the second electrode being electrically coupled to the first electrode; and a cable electrically coupled to the second electrode.

8. The cable coupling structure of claim 7, wherein the opposing surface is exposed in the extending portion.

9. The cable coupling structure of claim 8, wherein the extending portion is cantilevered from the end of the substrate.

10. The cable coupling structure of claim 7, wherein the opposing surface opposes an end surface of the substrate in the extending portion.

11. The cable coupling structure of claim 7, wherein the opposing surface of the insulating member further covers one or more of the first electrode and functional element.

12. The cable coupling structure of claim 7, further comprising a wiring disposed in the surface of the substrate to electrically connect the first and second electrodes.

13. The cable coupling structure of claim 7, wherein the cable includes a conductor extending from an insulator covering the conductor, the conductor being electrically coupled to the second electrode.

14. The cable coupling structure of claim 13, wherein the conductor is a center conductor of a coaxial cable.

* * * * *